US012394938B2

(12) United States Patent
Chen et al.

(10) Patent No.: US 12,394,938 B2
(45) Date of Patent: Aug. 19, 2025

(54) FORCE SAVING MECHANISM FOR CIRCUIT BOARD INSTALLATION

(71) Applicant: Quanta Computer Inc., Taoyuan (TW)

(72) Inventors: Chao-Jung Chen, Taoyuan (TW); Chih-Wei Lin, Taoyuan (TW); Chia-Wei Huang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 392 days.

(21) Appl. No.: 17/819,431

(22) Filed: Aug. 12, 2022

(65) Prior Publication Data

US 2023/0387629 A1 Nov. 30, 2023

Related U.S. Application Data

(60) Provisional application No. 63/345,538, filed on May 25, 2022.

(51) Int. Cl.
*H01R 13/629* (2006.01)
*H05K 7/14* (2006.01)
(52) U.S. Cl.
CPC . *H01R 13/62961* (2013.01); *H01R 13/62938* (2013.01); *H05K 7/1409* (2013.01); *H01R 13/62944* (2013.01)

(58) Field of Classification Search
CPC ........ H01R 13/62961; H01R 13/62938; H01R 13/62944; H05K 7/1409
See application file for complete search history.

(56) References Cited

U.S. PATENT DOCUMENTS

| 6,354,164 B1* | 3/2002 | Megason ................ F16H 51/00 439/157 |
| 8,976,536 B2* | 3/2015 | French, Jr. ........... H05K 7/1427 361/755 |
| 11,596,069 B2* | 2/2023 | Chen ....................... H01R 12/82 |
| 2009/0086422 A1* | 4/2009 | McClure ............ H05K 7/20727 361/679.48 |

* cited by examiner

*Primary Examiner* — Renee S Luebke
*Assistant Examiner* — Paul D Baillargeon
(74) *Attorney, Agent, or Firm* — NIXON PEABODY LLP

(57) ABSTRACT

A connector assembly that may be used to connect an upper circuit board to a lower circuit board is disclosed. The connector assembly includes a base, and a bracket mechanically fastened to the base. The connector assembly also has a handle rotatably coupled to the base. The connector assembly includes a link bar movably coupling the handle to the base. The connector assembly further includes a guiding feature mechanically coupled between the base and the bracket. The guiding feature is configured to direct relative motion between the base and the bracket. The link bar and the guiding feature are also configured to transfer an external force applied to the handle, the external force being transferred to the upper and lower circuit boards via the base and the bracket.

20 Claims, 5 Drawing Sheets

FORCE SAVING MECHANISM FOR CIRCUIT BOARD INSTALLATION

CROSS-REFERENCE TO RELATED APPLICATIONS

This application claims priority from and benefit of U.S. Provisional Patent Application Ser. No. 63/345,538, filed on May 25, 2022, titled "Universal force saving mechanism for boards installation," which is hereby incorporated by reference herein in its entirety.

TECHNICAL FIELD

The present disclosure relates generally to mechanisms to connect circuit boards, and more specifically, to a connection mechanism allowing easy assembly of two circuit boards.

BACKGROUND

Computer servers are computer devices generally designed for certain specialized functions. Servers generally include common components such as processors, memory, a cooling system, and a power system. Generally, servers have a chassis that has walls of a certain height that may be standardized for insertion of the chassis in racks in a data center. The chassis generally holds a motherboard with the basic components such as the processors, dual in-line memories (DIMMs), storage devices, fans, and power supplies. Servers can be specially designed to enhance performance of certain functions. For example, an application server may have relatively more processors for processing applications, or a storage server may have more storage devices for more storage capability. However, it is often desirable to expand the functions of the server through additional components, such as network interface cards, memories, or processors.

Modern servers are designed to allow a user the flexibility of adding or enhancing functions in a computer system through adding circuit boards with additional hardware for enhanced functionality. The additional circuit boards that may be inserted in the server chassis over an existing circuit board, and include functional components that may be electrically connected to the other server components through the existing circuit board. A server chassis generally has a horizontally oriented motherboard at the bottom of the chassis. Additional circuit boards can be inserted on connectors extending from the motherboard.

For example, an upper expansion circuit board may be placed on a lower circuit board that may be a motherboard for a server. The lower circuit board may include a number of rectangular shaped board-to-board connectors. Each of the board-to-board connectors may be electrically connected to corresponding connectors on the bottom side of the upper circuit board. A series of spacers extend from each corner of the board-to-board connectors. The spacers help support the upper circuit board. Each spacer is a cylinder that has a hole to receive a fastening mechanism such as a screw. Thus, where there are four board-to-board connectors, there are sixteen total spacers; thereby requiring sixteen screws to attach the upper circuit board with the lower circuit board.

Assembly of the upper circuit board to the lower circuit board is accomplished by lowering the upper circuit board so the connectors mate to the board-to-board connectors on the lower circuit board. Once the board-to-board connectors of the lower circuit board are mated with the connectors on the bottom of the upper circuit board, a locking mechanism may be engaged to insure electrical connection. A lever or other mechanism may be used to join various connection mechanisms such as pins and slots. The last step is to insert screws to fix the upper circuit board to each of the spacers of the lower circuit board. Thus, in the case of four board-to-board connectors, each with four spacers, sixteen screws are required.

However, when disassembling the circuit boards, it is difficult to ensure a user removes all sixteen of the screws before activating the unlocking mechanism to disassemble the upper circuit board from the lower circuit board. Users often do not know which screws should be installed or disassembled when assembling or disassembling a complicated pattern of screws on the upper circuit board. A user may reference a manual or review descriptions in a standard operation procedure (SOP) file for the circuit boards, but consulting such references increases the time for the disassembly operation. Mistakes in removing the wrong screw may potentially damage the structure due to improper operation. Alternatively, if a user fails to remove one of the screws, the upper circuit board may be damaged when the user attempts to pull it away from the lower circuit board.

Thus, there is a need for a quick connection mechanism that is capable of connecting and disconnecting two circuit boards without relying on screws. There is another need for a mechanical device in a connection assembly that effectively transfers the force applied when connecting and disconnecting the circuit boards.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

An example connector assembly for connecting an upper circuit board to a lower circuit board is disclosed. The connector assembly includes a base, and a bracket mechanically fastened to the base. The connector assembly also has a handle rotatably coupled to the base. The connector assembly includes a link bar movably coupling the handle to the base. The connector assembly further includes a guiding feature mechanically coupled between the base and the bracket. The guiding feature is configured to direct relative motion between the base and the bracket. The link bar and the guiding feature are also configured to transfer an external force applied to the handle, the external force being transferred to the upper and lower circuit boards via the base and the bracket.

A further implementation of the example connector assembly is where the bracket is removably coupled to the base of the connector assembly. In another implementation, the bracket is removably coupled to the base of the connector assembly by one or more screws. Another implementation is where the connector assembly includes at least one gear bar coupled to the base of the connector assembly. The handle further includes at least one gear configured to engage the at least one gear bar. In another implementation, the handle is movably coupled to the base of the connector assembly by two link bars. In yet another implementation, the two gear bars are coupled to the base of the connector assembly, and the handle includes two gears configured to engage the two gear bars.

For another implementation, the upper circuit board includes a first board-to-board connector and the lower circuit board includes a second board-to-board connector. In such implementations, the first and second board-to-board connectors are configured to mate the upper and lower circuit boards together. The board-to-board connectors are further rectangular in shape in some implementations. For another implementation, rotating the handle from an open position to a closed position causes corresponding board-to-board connectors coupled to the upper and lower circuit boards to become mated. In yet another implementation, the upper circuit board is removably coupled to the base of the connector assembly via one or more fasteners, while the lower circuit board is removably coupled to the bracket. According to still another implementation, the at least one guiding feature is configured to direct relative motion between the base of the connector assembly and the bracket in a direction perpendicular to the upper and lower circuit boards.

Another disclosed example is a system having an upper circuit board with a first board-to-board connector, as well as a lower circuit board with a second board-to-board connector. The system includes a connector assembly for connecting the upper circuit board to the lower circuit board. The connector assembly further includes a base, and a bracket mechanically fastened to the base. The connector assembly also has a handle rotatably coupled to the base. The connector assembly includes a link bar movably coupling the handle to the base. The connector assembly further includes a guiding feature mechanically coupled between the base and the bracket. The guiding feature is configured to direct relative motion between the base and the bracket. The link bar and the guiding feature are also configured to transfer an external force applied to the handle, the external force being transferred to the upper and lower circuit boards via the base and the bracket.

Yet another disclosed example is a method of assembling an upper circuit board to a lower circuit board. The method includes removably coupling the upper circuit board to a base of a connector assembly. The method also includes removably coupling the base to a bracket having the lower circuit board. The method further includes rotating a handle of the connector assembly to a closed position such that a guiding feature and a link bar of the connector assembly direct relative motion between the base of the connector assembly and the base. A first board-to-board connector of the upper circuit board becomes mated to a second board-to-board connector of the lower circuit board in response to the handle being rotated into the closed position. The link bar and the guiding feature are also configured to transfer an external force that has been applied to the handle, the external force being transferred to the upper and lower circuit boards via the base and the bracket.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1A:
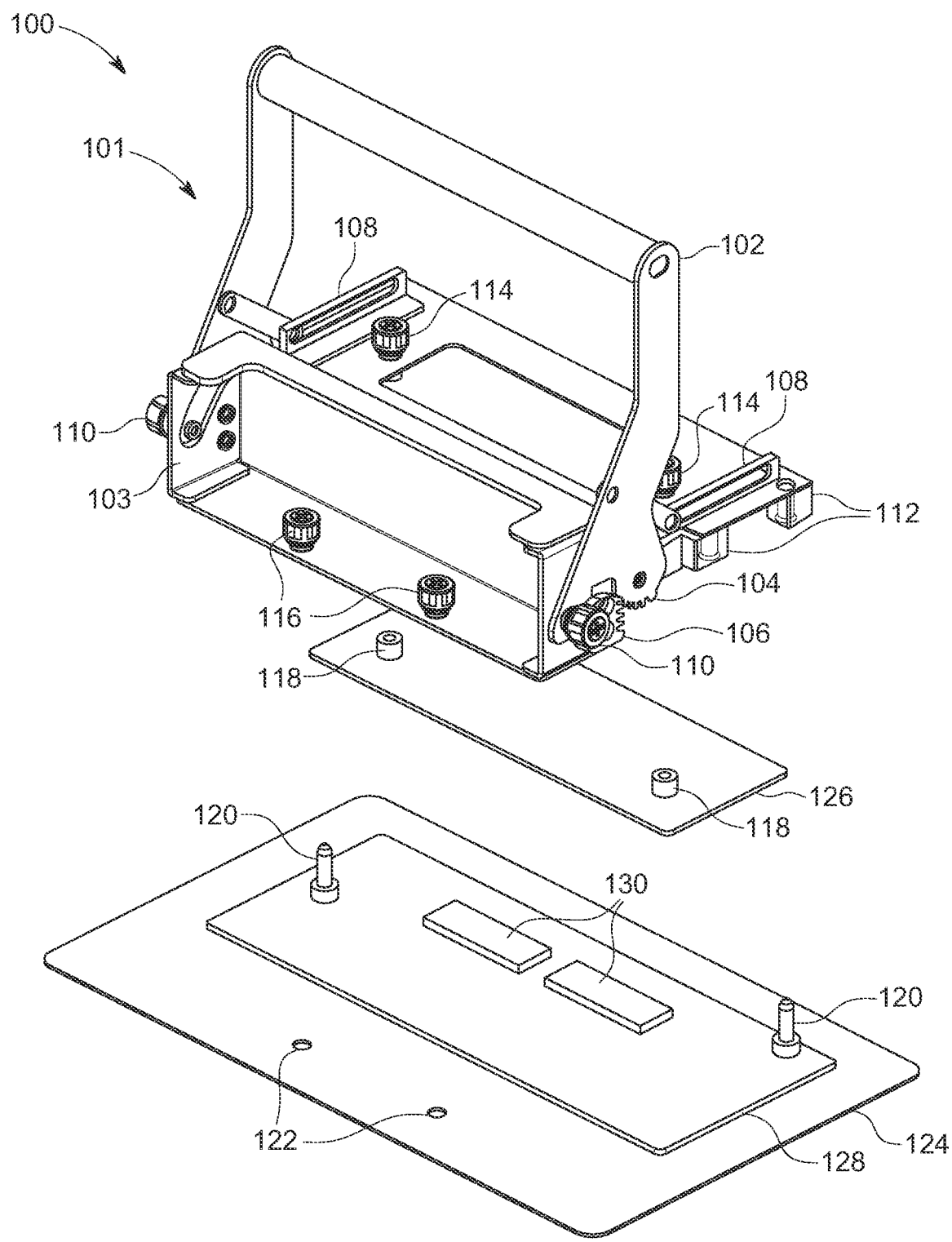
FIG. 1A is perspective view of a system with an example connector assembly, according to certain aspects of the present disclosure.

The present disclosure is directed toward a connector assembly that may be used to connect an upper circuit board to a lower circuit board is disclosed. The connector assembly includes a handle rotatably coupled to a base of the connector assembly. The connector assembly has at least one link bar movably coupling the handle to the base of the connector assembly. The connector assembly also has at least one guiding feature configured to direct relative motion between the base of the connector assembly and a bracket coupled to the base of the connector assembly. The link bar and guiding feature are also configured to take external force that has been applied to the handle, and transfer it to the upper and lower circuit boards via the base of the connector assembly and the bracket.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical", "horizontal", "parallel", and "perpendicular" are intended to additionally include "within 3-5% of" a vertical, horizontal, parallel, or perpendicular orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

FIGS. 1A-1D show perspective views of a system 100 having a connector assembly 101 in accordance with one embodiment. As an option, the present system 100 may be implemented in conjunction with features from any other embodiment listed herein, such as those described with reference to the other figures. However, such system 100 and others presented herein may be used in various applications and/or in permutations which may or may not be specifically described in the illustrative embodiments listed herein. Further, the system 100 presented herein may be used in any desired environment. Thus FIGS. 1A-1D (and the other figures) may be deemed to include any possible permutation.

Looking specifically now to FIG. 1A, the system 100 is shown as including the connector assembly 101, a bracket 124, as well as upper and lower circuit boards 126, 128, respectively. The connector assembly 101 itself is preferably configured to connect an upper circuit board to a lower circuit board. Accordingly, the present implementation is shown as including a handle 102 that is coupled to a base 103 of the connector assembly 101. More specifically, the handle 102 (e.g., lever) is rotatably coupled to a base 103 of the connector assembly 101 by rotatable fixtures 110.

Rotatable fixtures 110 are thereby preferably able to couple the handle 102 to the base 103 without inhibiting the rotational movement of the handle 102 from an open position to a closed position (e.g., see FIGS. 1C-1D below). Accordingly, rotatable fixtures 110 may have a first portion configured to fix (e.g., physically couple) the handle 102 to the base 103, in addition to a second portion that is configured to facilitate rotation of the handle 102 between the open and closed (e.g., locked) positions. According to an example, which is in no way intended to be limiting, handle 102 may include SAE1215, or any other desired type of free cutting steel.

According to an example, which is in no way intended to limit the invention, the rotatable fixtures 110 may each include a threaded body configured to fix the handle 102 to the base 103 such that the handle 102 is unable to shift laterally, in addition to a rotating sleeve portion that is actually physically coupled to the handle 102. Thus, the fixtures 110 are able to allow rotational movement of the handle 102 while fixing it laterally with respect to the base 103. However, it should be noted that a variety of different designs may be implemented for the handle and/or fixtures 110, e.g., depending on the desired implementation.

The handle 102 is also coupled to the base 103 of the connector assembly 101 by at least one link bar 108. The at least one link bar 108 movably couples the handle 102 to the base 103 such that rotatable movement of the handle 102 is performed in a controlled and directed manner. In other words, the link bars 108 seen in FIG. 1A are able to couple the handle 102 to the base 103, while still facilitating movement therebetween. According to an example, which is in no way intended to be limiting, one or more of the link bars 108 may include SGCC, or any other desired type of galvanized sheet steel.

Looking to the design of the link bars 108, a first portion of the link bars 108 is coupled to vertical arms of the handle 102, while a second portion of the link bars 108 is coupled to an upper surface of the base 103. While the first and second portions of the link bars 108 are coupled to the handle 102 and base 103 respectively, the first and second portions of the link bars 108 may move relative to each other. For example, as the handle 102 is rotated from the open position to the closed position, fixtures 110 guide the rotational movement of the handle (relative to the base 103), while first and second portions of the link bars 108 move (e.g., rotate, slide, etc.) relative to each other such that the handle ultimately reaches the closed position (e.g., see FIG. 1D). However, this design of the link bars is in no way intended to be limiting, and one or more of the link bars included in a given implementation may have a different design that preferably facilitates controlled movement of the handle 102 relative to the base 103.

The base 103 further includes at least one gear bar 106 that is coupled thereto. Gear bars 106 are preferably coupled to the base 103 such that lateral and rotational movement of the gear bars 106 is prevented. The gear bars 106 may thereby be coupled to the base 103 using one or more fasteners, adhesives, fabrication processes (e.g., welding), etc. Gear bars 106 can thereby be easily replaced in some approaches, e.g., in response to experiencing damage, to implement a different gear ratio to impact the efficiency by which external force applied to the handle 102 is transferred to circuit boards 126, 128 (e.g., as will be described in further detail below), etc. In other approaches, one or more of the gear bars 106 may be physically formed in the base 103 during a manufacturing process, e.g., as would be appreciated by one skilled in the art after reading the present description. According to an example, which is in no way intended to be limiting, one or more of the gear bars 106 may include a zinc alloy.

The handle 102 further includes one or more portions thereof that are configured as gears 104. These gears 104 are configured to rotatably engage the gear bars 106, again preferably such that the handle 102 may be rotated from an open position to a closed position in a controlled manner. While the gears 104 are depicted as being formed from a portion of the handle 102 itself using one or more additive and/or subtractive manufacturing processes, the gears 104 may be implemented differently depending on the approach. For instance, in some approaches one or more of the gears 104 may be coupled to the base 103 using one or more fasteners, adhesives, fabrication processes (e.g., welding), etc. Gears 104 may also be easily replaced in some approaches, e.g., in response to experiencing damage, to implement a different gear ratio to impact the efficiency by which external force applied to the handle 102 is transferred to circuit boards 126, 128 (e.g., as will be described in further detail below), etc.

In some implementations, the gears 104 and gear bars 106 may each include gear teeth that interlock with each other and assist in facilitating the rotational movement of the handle 102. In other words, the gears 104 and gear bars 106 may actually be rotatably coupled to each other such that gear teeth of the gear bars 106 engage the gear teeth of the gears 104 while the handle 102 is rotated between the closed and open positions. However, the gears 104 and gear bars 106 may implement any desired design (e.g., configuration) that is able to facilitate the rotational movement of the handle 102 relative to the base 103, e.g., as would be appreciated by one skilled in the art after reading the present description.

Although the handle 102 and base 103 are rotatably coupled to each other as described in the various approaches herein, the connector assembly 101 may also be coupled to a bracket 124. Depending on the implementation, the bracket 124 may or may not be part of the connector assembly. For instance, in some implementations the bracket may simply be a portion of a server frame (e.g., as chassis) that is at least removably coupled to the base of the connector assembly 101. In other implementations, the bracket may actually be a portion of the connector assembly 101. It follows that the connector assembly 101 may be coupled to an existing structure (e.g., such as a server having an existing circuit board) in some situations, while in others the connector assembly 101 serves as a standalone assembly that is capable of connecting loos circuit boards that have not yet been implemented in an existing structure.

As shown in FIG. 1A, the connector assembly 101 may be coupled to the bracket 124 using fixtures 116 that align with recesses (e.g., through holes) 122 in the bracket 124. The bracket 124 may be a support bracket in some implementations. The fixtures 116 are preferably configured such that they may be easily tightened and loosened without applying any force to the circuit boards 126, 128, the bracket 124, other components that are also coupled to the bracket 124 (e.g., such as a remainder of a server chassis), etc. For example, the fixtures 116 may include screws in some implementations. However, the connector assembly 101 may be coupled to the bracket 124 using any desired type and/or number of fixtures, adhesives, interlocking components, clamps, etc.

As noted above, a circuit board that is already implemented in a server on a chassis may be expanded upon by selectively coupling a second circuit board thereto. Accordingly, by coupling the base 103 of the connector assembly 101 to the server chassis, the connector assembly 101 and bracket 124 are able to transfer force applied to the handle 102 directly to the circuit boards 126, 128, e.g., as would be appreciated by one skilled in the art after reading the present description. Factors including the length of the vertical arms of the handle 102, the size of the gears 104 and/or gear bars 106, the configuration of the link bars 108, etc., may affect the amount of force applied to the handle that is ultimately transferred to the circuit boards being mated.

The connector assembly 101 additionally includes one or more guiding features 112 that are preferably configured to direct relative motion between the base 103 of the connector assembly 101 and the bracket 124. These guiding features may include guide blocks, pins, pistons, mechanical hinges, etc. that are able to direct relative motion between the base 103 of the connector assembly 101 and the bracket 124 such that the board-to-board connectors of circuit boards 126, 128 align and mate to each other in response to a force being applied to the handle 102, rotating it to the closed position (e.g., see FIG. 1D). In some implementations, the guiding features 112 may interact with one or more supplemental features of the bracket 124 and/or the circuit boards 126, 128 themselves. According to an example, which is in no way intended to be limiting, one or more of the guiding features 112 and/or any sub-components thereof may include a zinc alloy, or any other desired type of free cutting steel.

As noted above, servers may be designed to allow a user the flexibility of adding or enhancing functions in a system through adding circuit boards with additional hardware. Accordingly, it may be desired that the upper and lower circuit boards 126, 128 be physically and functionally (e.g., electrically) coupled to each other to increase performance of the system 100 as a whole.

For example, an upper expansion circuit board may be placed on a lower circuit board that is a motherboard for a server. Accordingly, the upper and/or lower circuit boards 126, 128 may include a number of rectangular shaped board-to-board connectors. Each of the board-to-board connectors 130 positioned on a top side of the lower circuit board 128 may be electrically connected to corresponding board-to-board connectors (not shown) on the bottom side of the upper circuit board 126. While the lower circuit board 128 is illustrated as including two board-to-board connectors 130, the upper circuit board 126 and/or the lower circuit board 128 may include three, four, five, etc. rectangular shaped board-to-board connectors 130 that extend therefrom. However, it is preferred that the upper and lower circuit boards 126, 128 include a corresponding number of board-to-board connectors 130 that are configured to mate to each other.

A series of spacers 120 are also located in proximity to each corner of the board-to-board connectors 130. For instance, the spacers 120 extending from the lower circuit board 128 help support the upper circuit board 126. Similarly, spacers 118 extending from an upper surface of the upper circuit board 126 assist with maintaining a desired amount of separation between the upper circuit board 126 and the base 103 of the connector assembly 101. In some approaches, one or more of the spacers 118, 120 may be a cylinder that has a hole to receive a fastening mechanism, e.g., such as a screw.

In some implementations, the board-to-board connectors that connect the upper and lower circuit boards may be high-force connectors. In other words, the board-to-board connectors may be coupled to each other as a result of applying a relatively high amount of physical force on the corresponding circuit boards. With respect to the present description, a "relatively high amount of force" is at least more force than associated with coupling two circuit boards together using fastening mechanisms. These high-force connectors may engage each other and couple the circuit boards together as a result of applying a force to the circuit boards that is at least 5 times higher than any external forces experienced by the circuit boards during normal operation of the system. In other implementations, the high-force connectors may engage each other and couple the circuit boards together as a result of applying a force to the circuit boards that is at least 6 times higher, 7 times higher, 8 times higher, 9 times higher, 10 times higher, at least 20 times higher, at least 30 times higher, etc., than any external forces experienced by the circuit boards during normal operation of the system, but could be higher or lower. It follows that the high-force connectors may be configured to mate the circuit boards to each other as a result of a relatively high amount of force being applied thereto.

It follows that assembly of the upper circuit board to the lower circuit board is accomplished by lowering the upper circuit board so the connectors mate to the board-to-board connectors on the lower circuit board. However, the lower circuit board is often already implemented in a particular configuration (e.g., server) and therefore may be prone to damage. This is especially true in implementations that involve applying enough force to the circuit boards that they mate to each other via one or more high-force connectors.

Referring still to FIG. 1A, the connector assembly 101 is thereby preferably configured to safely apply significant amounts of force on circuit boards being mated. For instance, by coupling the connector assembly 101 to the circuit boards themselves, and having a mechanical system that is able to efficiently transfer external force applied by a user to the circuit boards being mated, the connector assembly 101 is desirably able to avoid situations where the force applied to mate the circuit boards to each other is misaligned relative to a force associated with successfully mating the board-to-board connectors to each other. Moreover, the upper circuit board 126 may be removably coupled to the base 103 of the connector assembly 101 and/or the lower circuit board 128 may be removably coupled to the bracket 124, e.g., via one or more additional fasteners, adhesives, friction connections, etc.

As noted above, this avoids causing damage to the circuit boards and/or the substrates that the circuit boards may already be coupled to, despite applying a high amount of force. Not only does this improve the reliability by which circuit boards can be mated to each other, but also allows for high-force board-to-board connectors to be used. Again, previous systems that relied on using a number of fasteners to couple circuit boards and similar type components together suffered from inefficiencies and errors associated with actually inserting and removing each of the number of fasteners.

Figure 1B:
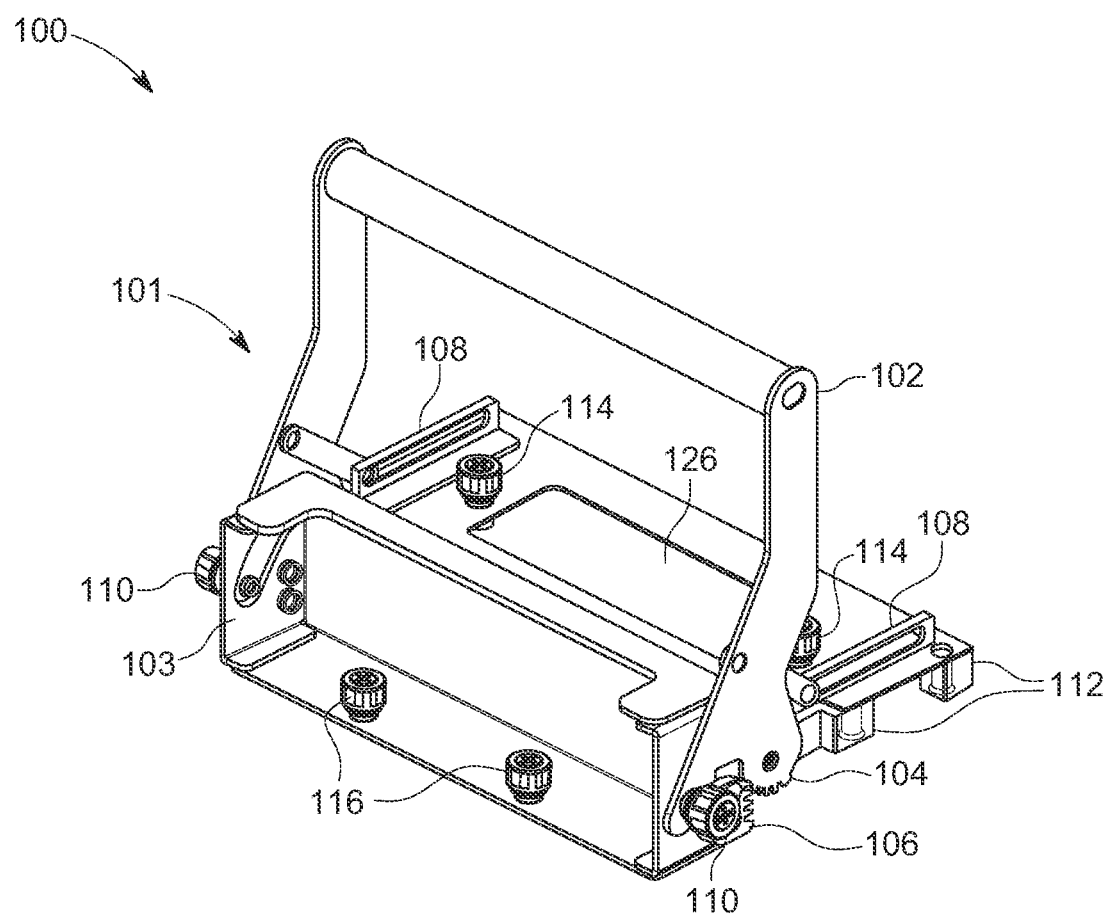
FIG. 1B is a perspective view of the system in FIG. 1A in the process of being assembled with the example connector assembly, according to certain aspects of the present disclosure.
Figure 1B:
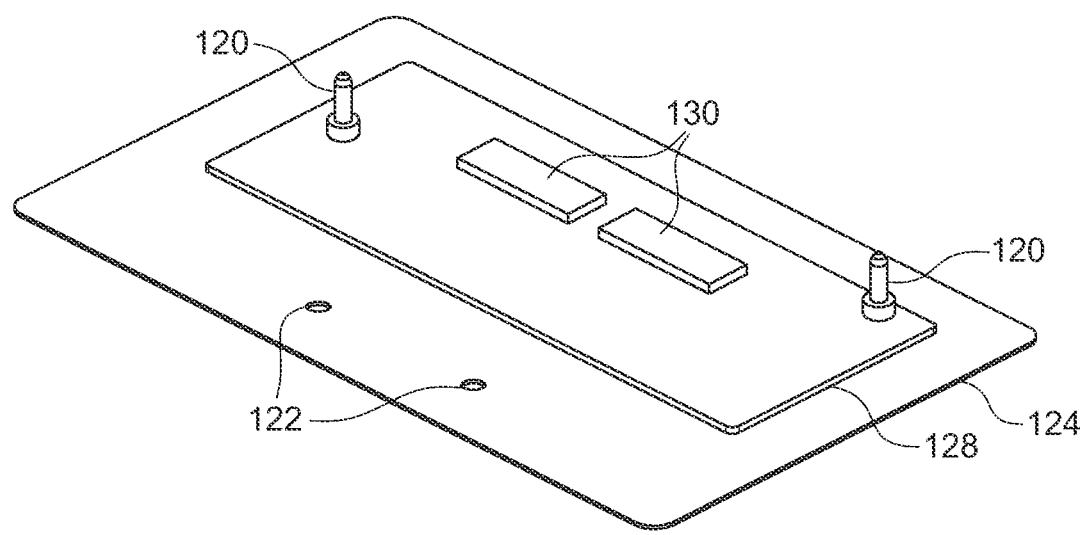

Looking now to FIG. 1B, upper circuit board 126 has been removably coupled to the base 103 by fixtures 114. Although not shown in the present view, the fixtures 114 may extend through the base 103 and into the spacers 118. Spacers 118 may thereby maintain a desired amount of separation between the upper circuit board 126 and the base 103 of the connector assembly 101, in addition to interacting with the fixtures 114 to couple the upper circuit board 126 to the base 103.

Figure 1C:
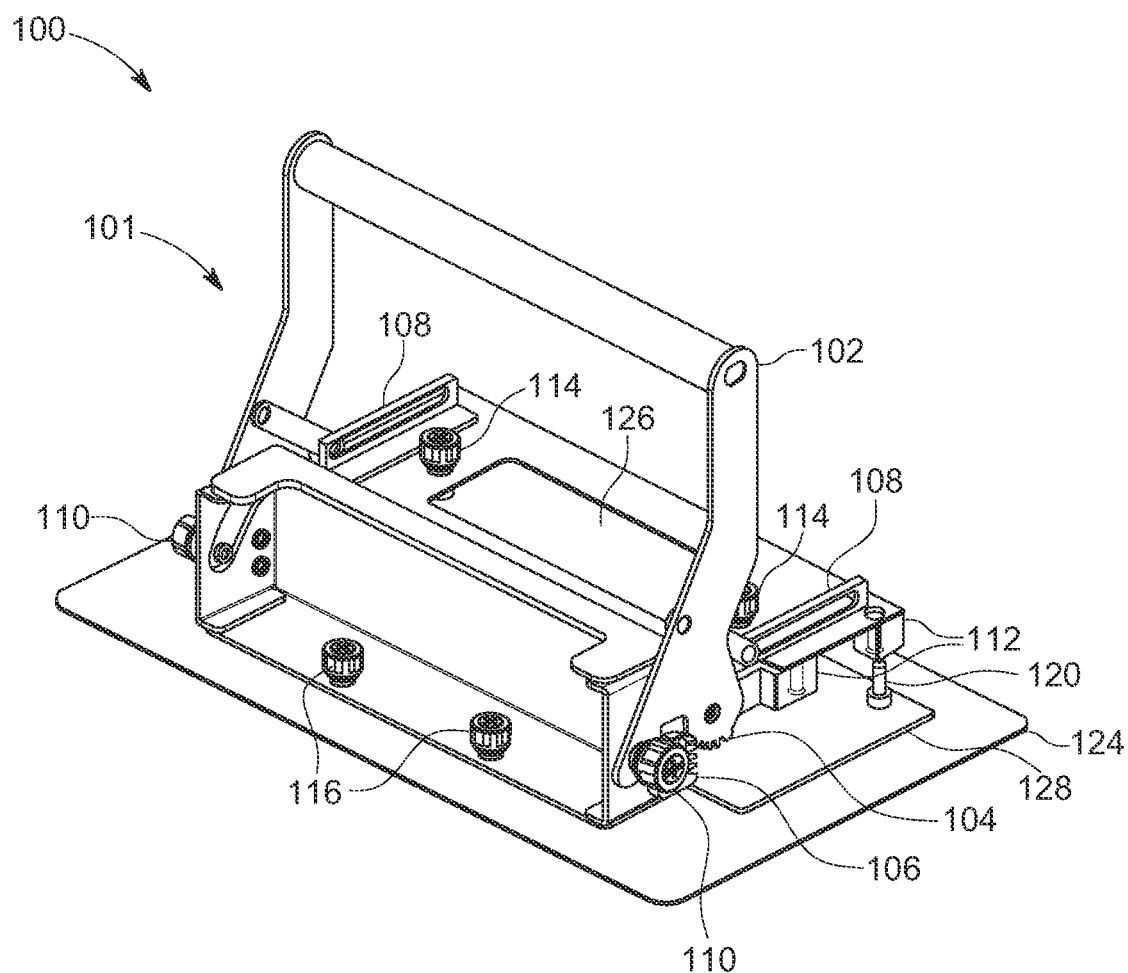
FIG. 1C is a perspective view of the system in FIG. 1A, the connector assembly having been assembled and in an open position, according to certain aspects of the present disclosure.

Proceeding to FIG. 1C, the connector assembly 101 has been removably coupled to the bracket 124. In the present implementation, the fixtures 116 engage recesses in the bracket 124 (e.g., see 122 of FIGS. 1A-1B) such that the connector assembly 101 and the bracket 124 are removably coupled to each other. In other implementations however, the connector assembly 101 and the bracket 124 may be coupled to each other using any desired clamps, adhesives, fasteners, etc. It should also be noted that the handle 102 is depicted in the open position, in which the link bars 108 are fully extended.

Guiding features 112 of the connector assembly 101 are also shown as being aligned with spacers 120 coupled to the lower circuit board 128 and/or the bracket 124. Upper portions of the spacers 120 are configured to pass through a recess in the guiding features 112 in some approaches. The guiding features 112 and spacers 120 may thereby operate in combination with each other to facilitate the directed relative motion between at least the upper and lower circuit boards 126, 128. The guiding features 112 are preferably configured to direct relative motion between the base 103 of the connector assembly 101 and the bracket 124 in a direction perpendicular to planes extending along the larger faces of each of the upper and lower circuit boards. This desirably directs force applied to the handle 102 to the circuit boards 126, 128 and the board-to-board connectors thereof, preferably such that they may be mated to each other in response to the handle 102 being rotated into the closed position (e.g., as seen in FIG. 1D).

However, a wider portion seen at the base of the spacers 120 coupled directly to the lower circuit board 128 may be wider than a recess in the guiding features 112. It follows that although a narrower upper portion of the spacers 120 may be able to pass through recesses in the guiding features 112 to facilitate the directed relative motion between at least the upper and lower circuit boards 126, 128, the wider base of the spacers 120 defines a minimum amount of separation between the upper and lower circuit boards 126, 128. These wider bases of the spacers 120 limit this relative motion by coming into contact with a bottom surface of the guiding features 112, e.g., as seen in FIG. 1D below.

Figure 1D:
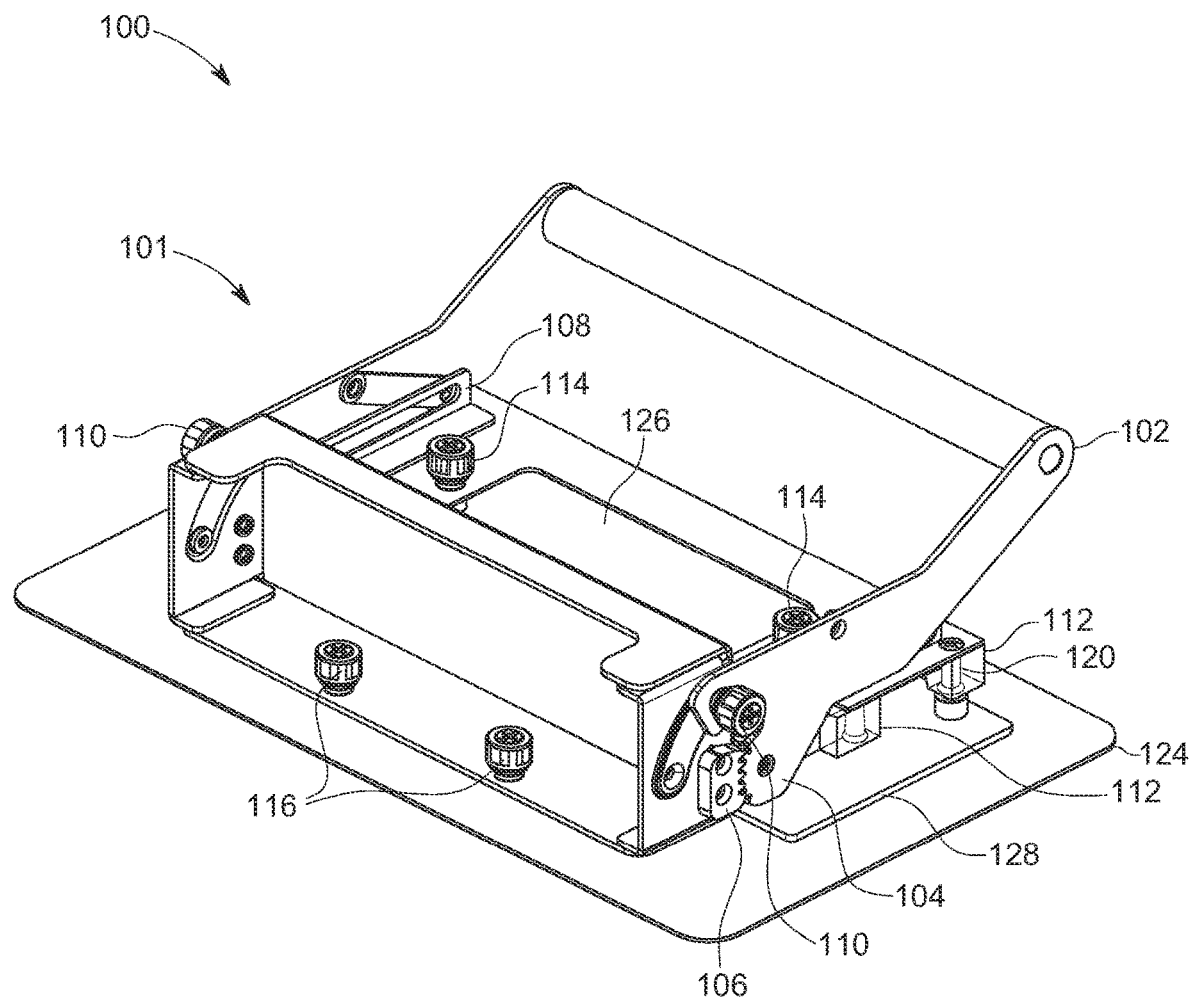
FIG. 1D is a perspective view of the system in FIG. 1A, the connector assembly having been assembled and in a closed position, according to certain aspects of the present disclosure.

FIG. 1D illustrates details associated with how various components included in the system 100 interact with each other while moving the handle 102 from an open position to a closed position. For instance, link bars 108 are in a retracted position as a result of rotating the handle about rotatable fixtures 110 to the closed position. Gears 104 and gear bars 106 also remain engaged with each other and contribute (along with fixtures 116) towards transferring the force applied to the handle 102, to the circuit boards. It follows that the link bars and guiding features are configured to efficiently transfer external force rotatably applied to the handle, to the upper and lower circuit boards via the base of the connector assembly and the bracket, e.g., as would be appreciated by one skilled in the art after reading the present description.

Figure 2A:
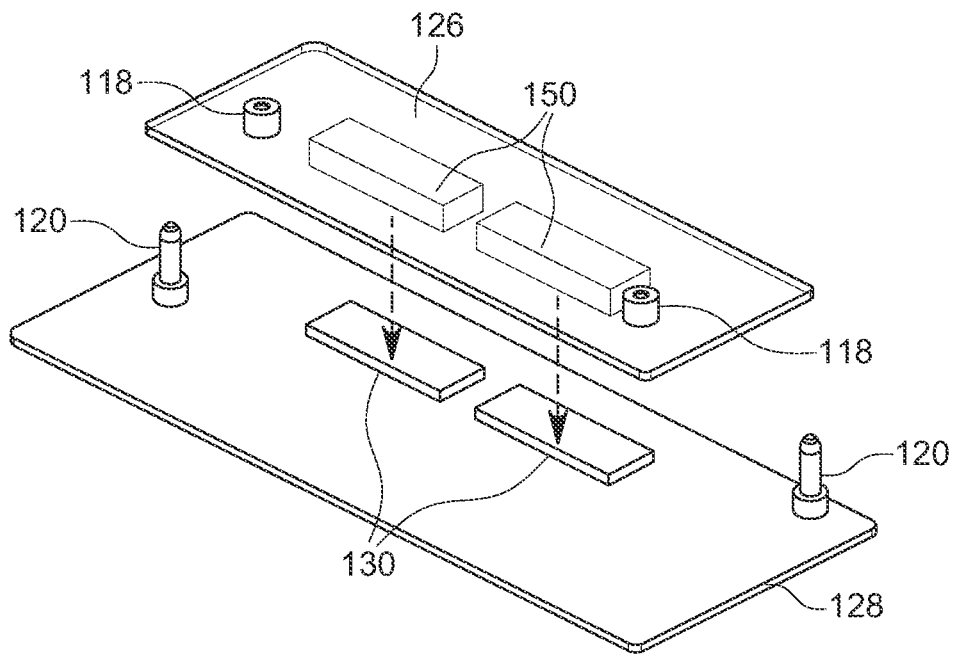
FIG. 2A is a detailed perspective view of upper and lower circuit boards in an open position, according to certain aspects of the present disclosure.
Figure 2B:
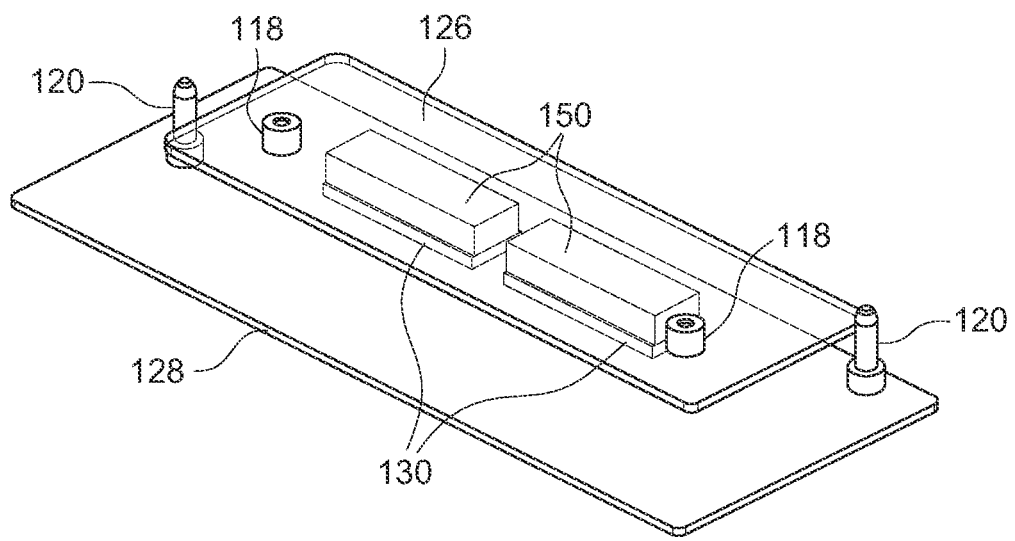
FIG. 2B is a detailed perspective view of upper and lower circuit boards in a closed position, according to certain aspects of the present disclosure.

FIGS. 2A-2B show detailed perspective views of upper and lower circuit boards 126, 128, each having board-to-board connectors 150, 130 respectively, in accordance with one embodiment. As an option, the present board-to-board connectors 150, 130 may be implemented in conjunction with features from any other embodiment listed herein, such as those described with reference to the other figures. For example, while circuit boards 126, 128 are not illustrated as being coupled to any systems or structures, it may be appreciated in some instances that the detailed perspective view in FIG. 2A corresponds to a connector assembly 101 being positioned in an open position (e.g., as seen in FIG. 1C), while the detailed perspective view in FIG. 2B corresponds to a connector assembly 101 being positioned in a closed position (e.g., as seen in FIG. 1D).

However, such board-to-board connectors 150, 130 and others presented herein may be used in various applications and/or in permutations which may or may not be specifically described in the illustrative embodiments listed herein. Further, the board-to-board connectors 150, 130 presented herein may be used in any desired environment. Thus FIGS. 2A-2B (and the other figures) may be deemed to include any possible permutation.

Looking specifically now to FIG. 2A, the upper and lower circuit boards 126, 128 are in a disconnected configuration and are separated from each other. Although separated in a first direction perpendicular to main sides of the circuit boards 126, 128, board-to-board connectors 150, 130 are shown as being aligned in the first direction (see dashed arrows). As noted above, a connector assembly may include one or more guiding features that can direct relative motion between a base of the connector assembly and a bracket. In other words, the guiding features are preferably configured to direct relative motion between the base and the bracket such that the board-to-board connectors 150, 130 of circuit boards 126, 128 align and mate to each other in response to a force being applied to a handle of the connector assembly, and rotating it to the closed position (e.g., see FIG. 1D).

In some implementations, the guiding features may interact with one or more supplemental features of the circuit boards 126, 128 themselves. For instance, the guiding features may engage and move along an upper, narrower portion of the spacers 120. This relative motion between the guiding features and the spacers 120 may further be defined (e.g., limited) by a lower, wider portion of the spacers 120 which may come into contact with a bottom surface of the guiding features when in a closed position (e.g., see FIG. 1D).

Moving to FIG. 2B, the upper and lower circuit boards 126, 128 are shown in a connected configuration, with the board-to-board connectors 150, 130 being mated to each other. As mentioned above, the relative motion between the guiding features and the spacers 120 may further be defined (e.g., limited) by the lower, wider portion of the spacers 120. This wider portion may come into contact with a bottom surface of the guiding features when the greater connector assembly is in a closed position. It follows that the dimensions of the lower, wider portion of the spacers 120 may be tuned such that the board-to-board connectors 150, 130 become mated to each other in response to the wider portion may come into contact with a bottom surface of the guiding features. In other words, the dimensions of the lower, wider portion of the spacers 120 may be tuned such that the board-to-board connectors 150, 130 become mated to each other in response to a handle of the connector assembly being rotated into a closed position.

The board-to-board connectors 150, 130 that connect the upper and lower circuit boards 126, 128 may be high-force connectors. In other words, the board-to-board connectors may be coupled to each other as a result of applying a relatively high amount of physical force on the corresponding circuit boards. As noted above, a "relatively high amount of force" is at least more force than associated with coupling two circuit boards together using fastening mechanisms. These high-force connectors may engage each other and couple the circuit boards together as a result of a relatively high amount of force being applied thereto. The board-to-board connectors 150, 130 may thereby become physically and electrically coupled to each other without relying on further mechanical coupling. It follows that the board-to-board connectors 150, 130 become mated and thereby couple the circuit boards 126, 128 together without using any other physical components, e.g., such as fasteners. As a result, the circuit boards 126, 128 may be quickly and efficiently coupled and/or decoupled from each other using a connector assembly as described herein.

According to an example, which is in no way intended to limit the invention, a pair of board-to-board connectors may have corresponding features that are configured to engage each other in response to a relatively high amount of force being applied thereto. For instance, one of the board-to-board connectors may have a plurality of sockets (e.g., recesses), while the second board-to-board connector has a plurality of terminals (e.g., extended regions) that are in a same orientation as the sockets. The first and second board-to-board connectors may thereby be configured such that the extended regions are able to engage the sockets, e.g., as a result of a relatively high amount of force being applied to the board-to-board connectors.

Additionally, the first board-to-board connector may include tabs that are configured to engage corresponding tabs of the second board-to-board connector. The tabs preferably include an electrically conducive material (e.g., one or more metals) such that the board-to-board connectors are electrically coupled to each other in addition to being mechanically coupled to each other. This desirably allows for the board-to-board connectors to facilitate communication between corresponding circuit boards while mated to each other.

The first board-to-board connector may be coupled (e.g., removably coupled) to the bottom surface of an upper circuit board being coupled (e.g., removably coupled) to a lower circuit board. Accordingly, the second board-to-board connector may be coupled to the top surface of a lower circuit board already coupled to a server chassis. It follows that by mating the first and second board-to-board connectors together, the corresponding circuit boards may be physically and functionally (e.g., electrically) coupled to each other. Moreover, the circuit boards may remain physically and functionally coupled to each other until a same, similar, or different connector assembly is removably coupled thereto, and used to selectively decouple the board-to-board connectors.

It follows that various ones of the implementations included herein are desirably able to removably couple two or more circuit boards to each other. This coupling of the circuit boards may be achieved as a result of using a connector assembly to safely apply significant amounts of force on the circuit boards. For instance, by coupling a connector assembly to the circuit boards themselves, and having a mechanical system that is able to efficiently transfer external force applied by a user to the circuit boards being mated, implementations herein are desirably able to avoid situations where the force applied to mate the circuit boards to each other is misaligned relative to a force associated with successfully mating the board-to-board connectors to each other.

As noted above, this desirably avoids causing damage to the circuit boards and/or the substrates that the circuit boards may already be coupled to, despite applying a high amount of force. Not only does this improve the reliability by which circuit boards can be mated to each other, but also allows for high-force board-to-board connectors to be used without relying on mechanical items like fasteners being used to actually mate the circuit boards to each other. Again, previous systems that relied on using a number of fasteners to couple circuit boards and similar type components together suffered from inefficiencies and errors associated with actually inserting and removing each of the number of fasteners.

A method of mating an upper circuit board to a lower circuit board may include any of the implementations included herein. According to an illustrative example, an upper circuit board may be removably coupled to a base of a connector assembly, while the base of the connector assembly may also be removably coupled to a bracket having the lower circuit board. By rotating a handle of the connector assembly to a closed position, at least one guiding feature and at least one link bar of the connector assembly direct relative motion between the base of the connector assembly and the bracket. As a result, a first board-to-board connector of the upper circuit board becomes mated to a second board-to-board connector of the lower circuit board in response to the handle being rotated into the closed position. Moreover, the link bar and guiding feature are preferably configured to transfer external force applied to the handle, to the upper and lower circuit boards via the base of the connector assembly and the bracket.

It should be noted that, while various aspects of the implementations herein have been illustrated as including specific designs, orientations, numbers of components, etc., this is in no way intended to limit the invention. Rather, the implementations herein are presented for exemplary purposes only and may vary in design, orientation, number of components, etc., depending on the desired approach. It should also be noted that use of the terms "bottom", "lower", "top", "upper", etc., are in no way intended to be limiting. Any frames of reference used to describe the various implementations herein have been selected for illustrative purposes only and may be adjusted as desired.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A connector assembly for connecting an upper circuit board to a lower circuit board, the connector assembly comprising:
   a base;
   a bracket mechanically fastened to the base;
   a handle rotatably coupled to the base;
   a link bar movably coupling the handle to the base;
   a guiding feature mechanically coupled between the base and the bracket, the guiding feature being configured to direct relative motion between the base and the bracket; and
   at least one gear bar coupled to the base;
   wherein the link bar and the guiding feature are configured to transfer an external force applied to the handle, the external force being transferred to the upper and lower circuit boards via the base and the bracket; and
   wherein the handle includes at least one gear configured to engage the at least one gear bar.

2. The connector assembly of claim 1, wherein the bracket is removably coupled to the base.

3. The connector assembly of claim 2, wherein the bracket is removably coupled to the base via one or more fasteners.

4. The connector assembly of claim 1, wherein the handle is movably coupled to the base via two link bars, the link bar being optionally one of the two link bars.

5. The connector assembly of claim 4, wherein two gear bars are coupled to the base, the handle having two gears configured to engage, respectively, the two gear bars.

6. The connector assembly of claim 1, further comprising the upper circuit board and the lower circuit board, the upper circuit board including a first board-to-board connector and the lower circuit board including a second board-to-board connector, the first and second board-to-board connectors being configured to mate the upper and lower circuit boards together.

7. The connector assembly of claim 6, wherein the board-to-board connectors are rectangular in shape.

8. The connector assembly of claim 1, wherein the handle is rotatable between an open position and a closed position.

9. The connector assembly of claim 8, further comprising the upper circuit board and the lower circuit board, each of the upper and lower circuit boards having corresponding board-to-board connectors, rotating the handle from the open position to the closed position causing the upper and lower circuit boards to mate via the corresponding board-to-board connectors.

10. The connector assembly of claim 1, further comprising the upper circuit board and the lower circuit board, the upper circuit board being removably coupled to the base via one or more fasteners, the lower circuit board being removably coupled to the bracket.

11. The connector assembly of claim 1, wherein the guiding feature is configured to direct relative motion between the base and the bracket in a direction perpendicular to the upper and lower circuit boards.

12. A system comprising:
    an upper circuit board having a first board-to-board connector;
    a lower circuit board having a second board-to-board connector; and
    a connector assembly for connecting the upper circuit board to the lower circuit board, the connector assembly comprising:
      a base;
      a bracket mechanically fastened to the base;
      a handle rotatably coupled to the base;
      a link bar movably coupling the handle to the base;
      a guiding feature mechanically coupled between the base and the bracket, the guiding feature being configured to direct relative motion between the base and the bracket; and
      at least one gear bar coupled to the base;
      wherein the link bar and the guiding feature are configured to transfer an external force applied to the handle, the external force being transferred to the upper and lower circuit boards via the base and the bracket; and
      wherein the handle includes at least one gear configured to engage the at least one gear bar.

13. The system of claim 12, wherein the handle is movably coupled to the base via two link bars, the link bar being optionally one of the two link bars, wherein two gear bars are coupled to the base, the handle having two gears configured to engage, respectively, the two gear bars.

14. The system of claim 12, wherein the first and second board-to-board connectors are configured to mate the upper and lower circuit boards together.

15. The system of claim 12, wherein the handle is rotatable between an open position and a closed position.

16. The system of claim 15, wherein rotating the handle from the open position to the closed position causes the first and second board-to-board connectors to become mated.

17. The system of claim 12, wherein the guiding feature is configured to direct relative motion between the base and the bracket in a direction perpendicular to the upper and lower circuit boards.

18. A method of assembling an upper circuit board to a lower circuit board, the method comprising:
- removably coupling the upper circuit board to a base of a connector assembly;
- removably coupling the base to a bracket having the lower circuit board;
- rotating a handle of the connector assembly to a closed position such that a guiding feature and a link bar of the connector assembly direct relative motion between the base and the bracket, a first board-to-board connector of the upper circuit board becoming mated to a second board-to-board connector of the lower circuit board in response to the handle being rotated into the closed position,
- wherein the link bar and the guiding feature are configured to transfer an external force applied to the handle, the external force being transferred to the upper and lower circuit boards via the base and the bracket; and
- wherein the handle includes at least one gear configured to engage at least one gear bar that is coupled to the base.

19. A connector assembly for connecting an upper circuit board to a lower circuit board, the connector assembly comprising:
- a base;
- a bracket mechanically fastened to the base;
- a handle having a vertical arm extending between an attached end and a free end, the attached end being rotatably coupled to the base, the handle rotating between an open position and a closed position;
- a plurality of link bars movably coupling the handle to the base, the plurality of link bars having a first portion that is attached to the vertical arm at a position located between the attached end and the free end, at least two of the plurality of link bars being slidable relative to each other; and
- a guiding feature mechanically coupled between the base and the bracket, the guiding feature being configured to direct relative motion between the base and the bracket;
- wherein the plurality of link bars and the guiding feature are configured to transfer an external force applied to the handle, the external force being transferred to the upper and lower circuit boards via the base and the bracket; and
- wherein the handle is movable relative to the plurality of link bars between the open position and the closed position.

20. The connector assembly of claim 19, wherein a first portion of the plurality of link bars is coupled to an arm of the handle, a second portion of the plurality of link bars being coupled to an upper surface of the base.

* * * * *